US006952028B2

(12) United States Patent
Lee et al.

(10) Patent No.: US 6,952,028 B2
(45) Date of Patent: Oct. 4, 2005

(54) FERROELECTRIC MEMORY DEVICES WITH EXPANDED PLATE LINE AND METHODS IN FABRICATING THE SAME

(75) Inventors: Kyu-Mann Lee, Gyeonggi-do (KR); Sang-Don Nam, Seoul (KR); Kun-Sang Park, Gyeonggi-do (KR)

(73) Assignee: Samsung Electronics Co., Ltd. (KR)

(*) Notice: Subject to any disclaimer, the term of this patent is extended or adjusted under 35 U.S.C. 154(b) by 7 days.

(21) Appl. No.: 10/624,327

(22) Filed: Jul. 22, 2003

(65) Prior Publication Data

US 2004/0124455 A1 Jul. 1, 2004

(30) Foreign Application Priority Data

Jul. 26, 2002 (KR) ................................ 10-2002-0044224

(51) Int. Cl.[7] ................................................ H01L 29/76

(52) U.S. Cl. ....................... 257/295; 257/298; 257/303; 257/306; 257/324; 438/3; 438/240

(58) Field of Search .................... 257/68, 71, 295–314, 257/324–326; 438/3, 240

(56) References Cited

U.S. PATENT DOCUMENTS 5,959,879 A * 9/1999 Koo ........................... 365/145
6,066,868 A * 5/2000 Evans, Jr. ................... 257/295
6,229,166 B1 * 5/2001 Kim et al. .................. 257/295
6,355,952 B1 * 3/2002 Yamoto et al. ............. 257/295
6,521,929 B2 * 2/2003 Ozaki ......................... 257/295
6,602,721 B2 * 8/2003 Mikawa et al. ................ 438/3
6,638,441 B2 * 10/2003 Chang et al. ................. 216/46
6,730,354 B2 * 5/2004 Gilbert et al. ......... 427/255.32
6,730,955 B2 * 5/2004 Shinohara et al. .......... 257/306
2002/0105017 A1 * 8/2002 Kim et al. .................. 257/295
2002/0196653 A1 * 12/2002 Kim et al. .................. 365/100
2003/0132470 A1 * 7/2003 Joshi et al. ................. 257/295

FOREIGN PATENT DOCUMENTS

KR 10-2003-0001217 1/2003
WO WO 99/65251 12/1999

OTHER PUBLICATIONS

Korean Notice to File Response to a Rejection (w/English Translation), dated May 28, 2004.

* cited by examiner

*Primary Examiner*—Andy Huynh
(74) *Attorney, Agent, or Firm*—Myers Bigel Sibley & Sajovec, P.A.

(57) ABSTRACT

A ferroelectric memory device includes a lower interlayer dielectric on a semiconductor substrate, a plurality of ferroelectric capacitors, and a plate line. The ferroelectric capacitors are on the lower interlayer dielectric. The plate line extends across and electrically connects to surfaces of at least two adjacent ones of the plurality of ferroelectric capacitors.

33 Claims, 16 Drawing Sheets

FERROELECTRIC MEMORY DEVICES WITH EXPANDED PLATE LINE AND METHODS IN FABRICATING THE SAME

RELATED APPLICATION

This application claims priority from Korean Patent Application No. 10-2002-0044224, filed on Jul. 26, 2002, the contents of which are herein incorporated by reference in their entirety.

FIELD OF THE INVENTION

The present invention relates to semiconductor devices, and more particularly, to ferroelectric memory devices with plate lines and methods of fabricating the same.

BACKGROUND OF THE INVENTION

Ferroelectric memory devices are nonvolatile devices that retain data after supply of power is stopped. They may also be operated at a supply voltage for the device, like some DRAM or SRAM devices. Ferroelectric memory devices may be used in, for example, smart cards or other memory cards.

FIGS. 1 through 4 are cross-sectional views illustrating a method of fabricating a conventional ferroelectric memory device.

Referring to FIG. 1, a device isolation layer 13 is formed at predetermined regions of a semiconductor substrate 11 to define active regions. Insulated gate electrodes 15, which serve as word lines, are formed to cross over the active regions and the device isolation layer 13. Impurity ions are implanted into the active region between the gate electrodes 15, to form source/drain regions 17*s* and 17*d*. A first lower interlayer dielectric (ILD) 19 is formed on the entire surface of the resultant structure on the source/drain regions 17*s* and 17*d*. The first lower ILD 19 is patterned to form storage node contact holes, which expose the source regions 17*s*. Contact plugs 21 are formed in the storage node contact holes.

Referring to FIG. 2, ferroelectric capacitors 32, which are 2-dimensionally arranged, are formed on the entire surface of the semiconductor substrate 11 including the contact plugs 21. Each of the ferroelectric capacitors 32 includes a lower electrode 27, a ferroelectric pattern 29, and an upper electrode 31, which are sequentially stacked. Each of the lower electrodes 27 covers one of the contact plugs 21. A first upper ILD 33 is formed on the entire surface of the semiconductor substrate including the ferroelectric capacitors 32. A plurality of main word lines 35, which are parallel to the gate electrodes 15, are formed on the first upper ILD 33. Each of the main word lines 35 may, for example, control four gate electrodes 15.

The upper and lower electrodes 31 and 27 may be formed of noble metals of the platinum group. Sidewalls of the ferroelectric capacitor 32 have sloped sidewalls, as illustrated in FIG. 4.

Referring to FIGS. 3 and 4, a second upper ILD 37 is formed on the entire surface of the semiconductor and the main word lines 35. The second upper ILD 37 and first upper ILD 33 are patterned to form via holes 39, which expose the upper electrodes 31. A wet etch process and a dry etch process may be performed to reduce an aspect ratio of each via hole 39. As illustrated in FIG. 3, the via hole 39 has sloped upper sidewalls 39*a*. A plurality of plate lines 41 are formed to cover the via holes 39. The plate lines 41 are disposed in parallel with the main word lines 35.

In another approach, the diameter of the via hole 39 may be increased to reduce an aspect ratio of the via hole 39. However, increasing the diameter may cause a short between the plate line 41 and the main word line 35. As the integration density of ferroelectric memory devices increases, it may become more difficult to properly align the via hole 39 with the upper electrode 31. Moreover, space "s" between the via hole 39 and the main word line 35 adjacent to the via hole 39 may become smaller. Increasing the diameter of the via hole 39, or misaligning the via hole 39 with the upper electrode 31, may result in the main word line 35 being exposed by the via hole 39 and a corresponding short between the plate line 41 and the main word line 35 (see FIG. 4).

Misalignment between the via hole 39 and the upper electrode 31 may also result in etching damage to the pattern 29. For example, the via hole 39 may be formed using an over-etching technique to facilitate connection between the subsequently formed plate line 41 and the upper electrode 31. During the formation of the via hole 39, the sloped sidewalls of the ferroelectric capacitor 32 may be exposed and damaged by the etching.

SUMMARY OF THE INVENTION

Various embodiments of the present invention provide a ferroelectric memory device that includes a lower interlayer dielectric on a semiconductor substrate, a plurality of ferroelectric capacitors, and a plate line. The ferroelectric capacitors are on the lower interlayer dielectric. The plate line extends across and electrically connects to top surfaces of at least two adjacent ones of the plurality of ferroelectric capacitors. The plate line may simplify the subsequent formation of a slit-type via hole through an upper interlayer dielectric to electrically contact the ferroelectric capacitors, and may reduce the effects of misalignment of the slit-type via hole.

In some further embodiments of the present invention, an upper interlayer dielectric is on the lower interlayer dielectric and the plurality of ferroelectric capacitors, and hydrogen barrier spacers are between sidewalls of the ferroelectric capacitors and the lower interlayer dielectric. The plate line cover sidewalls of the hydrogen barrier spacers and a top surface of the lower interlayer dielectric. The plate line includes a local plate line and a main plate line. The local plate line directly contacts top surfaces of the adjacent ferroelectric capacitors. The main plate line is on the upper interlayer dielectric opposite to the local plate line, and directly contacts a top surface of the local plate line via a slit-type via hole through the upper interlayer dielectric.

In still further embodiments, sidewalls of the ferroelectric capacitors may be substantially vertical relative to a top surface of the semiconductor substrate. For example, the sidewalls of the ferroelectric my have an inclination of about 70° to about 90° relative to a top surface of the semiconductor substrate.

DESCRIPTION OF EMBODIMENTS

Figure 1:
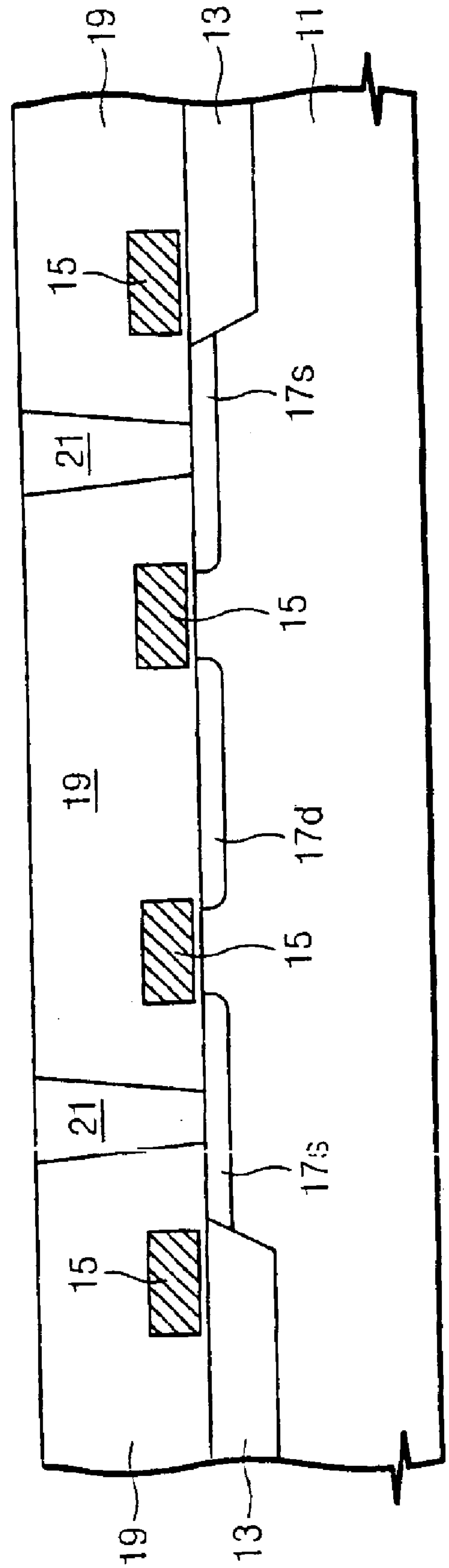
FIGS. 1 through 4 are cross-sectional views illustrating a method of fabricating a ferroelectric memory device according to the prior art.
Figure 2:
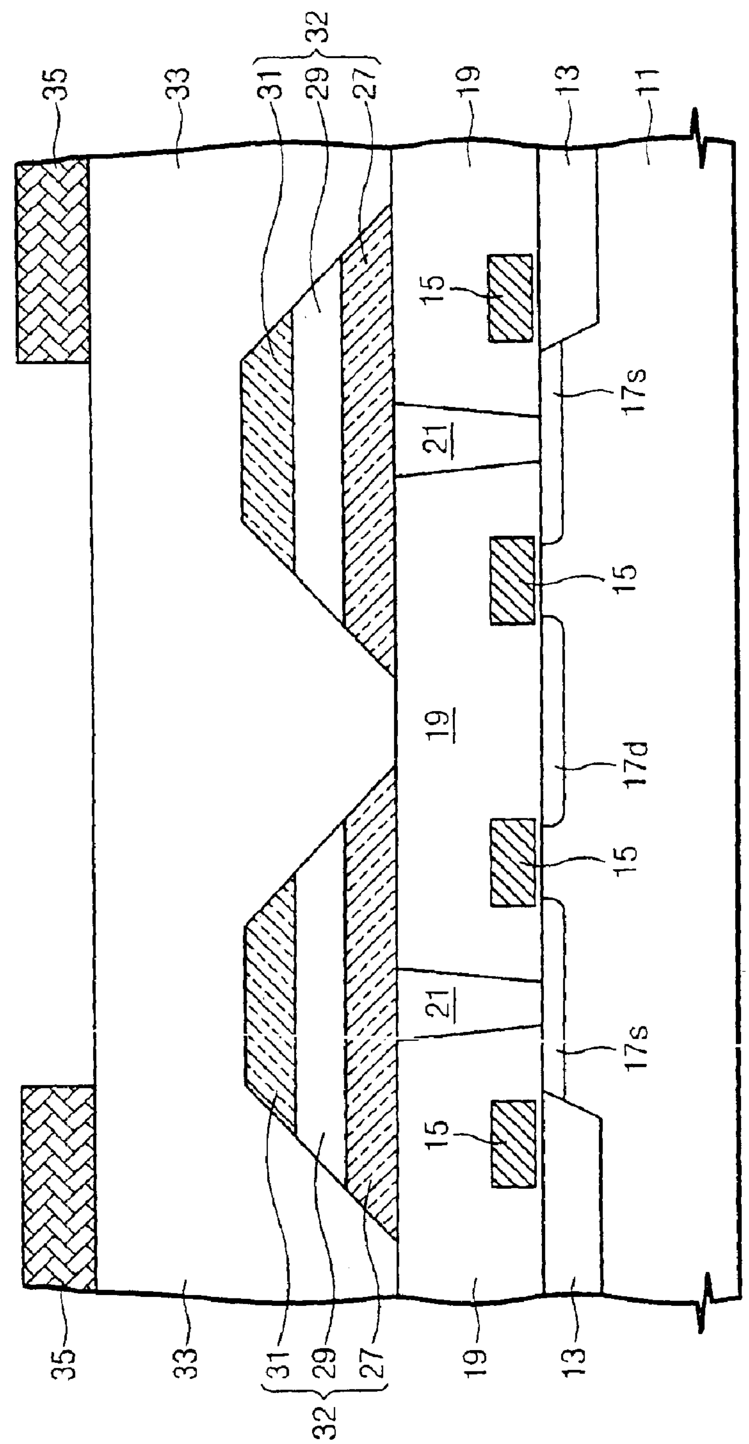

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout. It will be understood that if part of an element, such as a surface of a conductive line, is referred to as "top," it is further from the outside of the integrated circuit than other parts of the element. Furthermore, relative terms such as "beneath" may be used herein to describe a relationship of one layer or region to another layer or region relative to a substrate or base layer as illustrated in the figures. It will be understood that these terms are intended to encompass different orientations of the device in addition to the orientation depicted in the figures.

Figure 5:
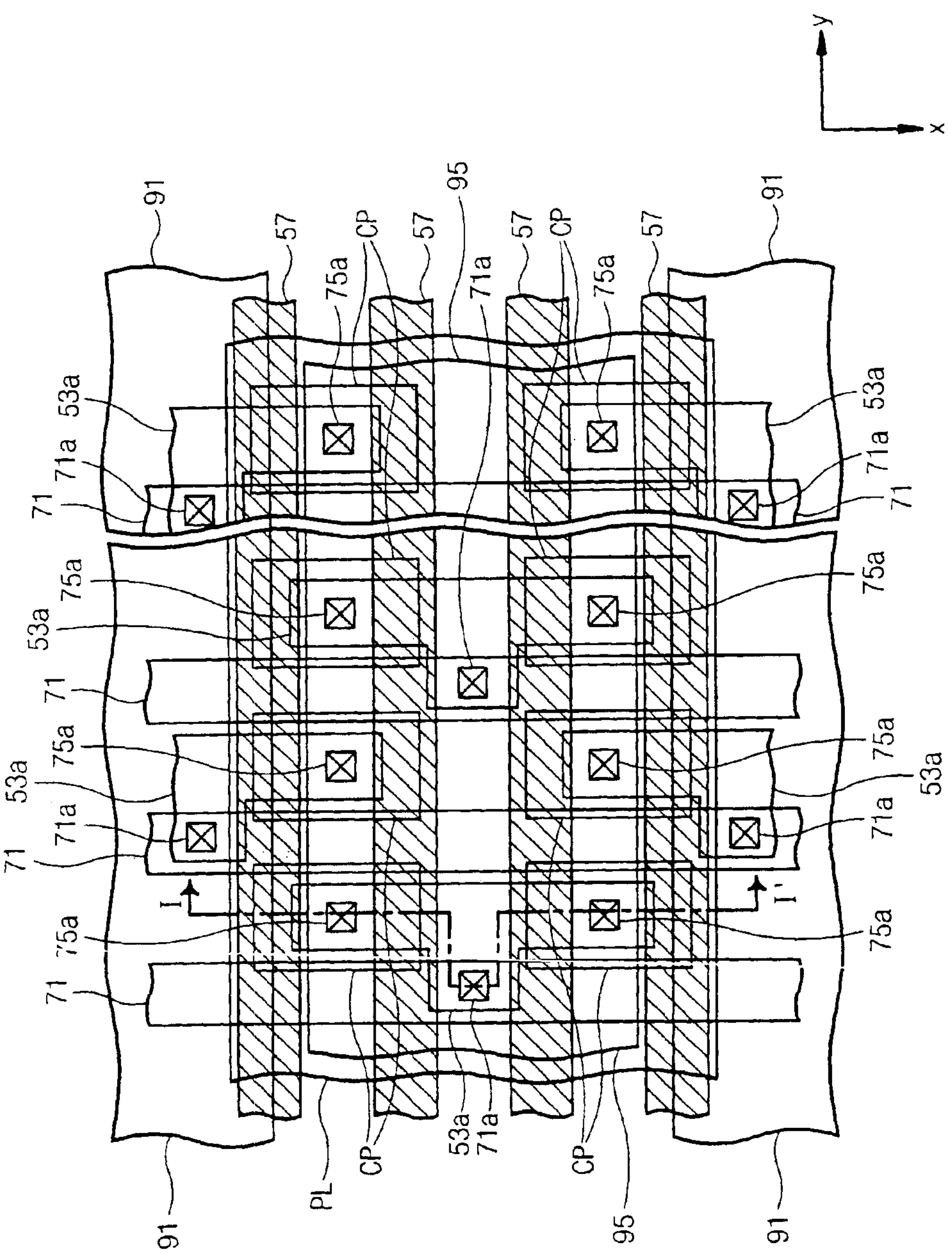
FIG. 5 is a top plan view illustrating methods of fabricating a ferroelectric memory device according to a various embodiments of the present invention.
Figure 6:
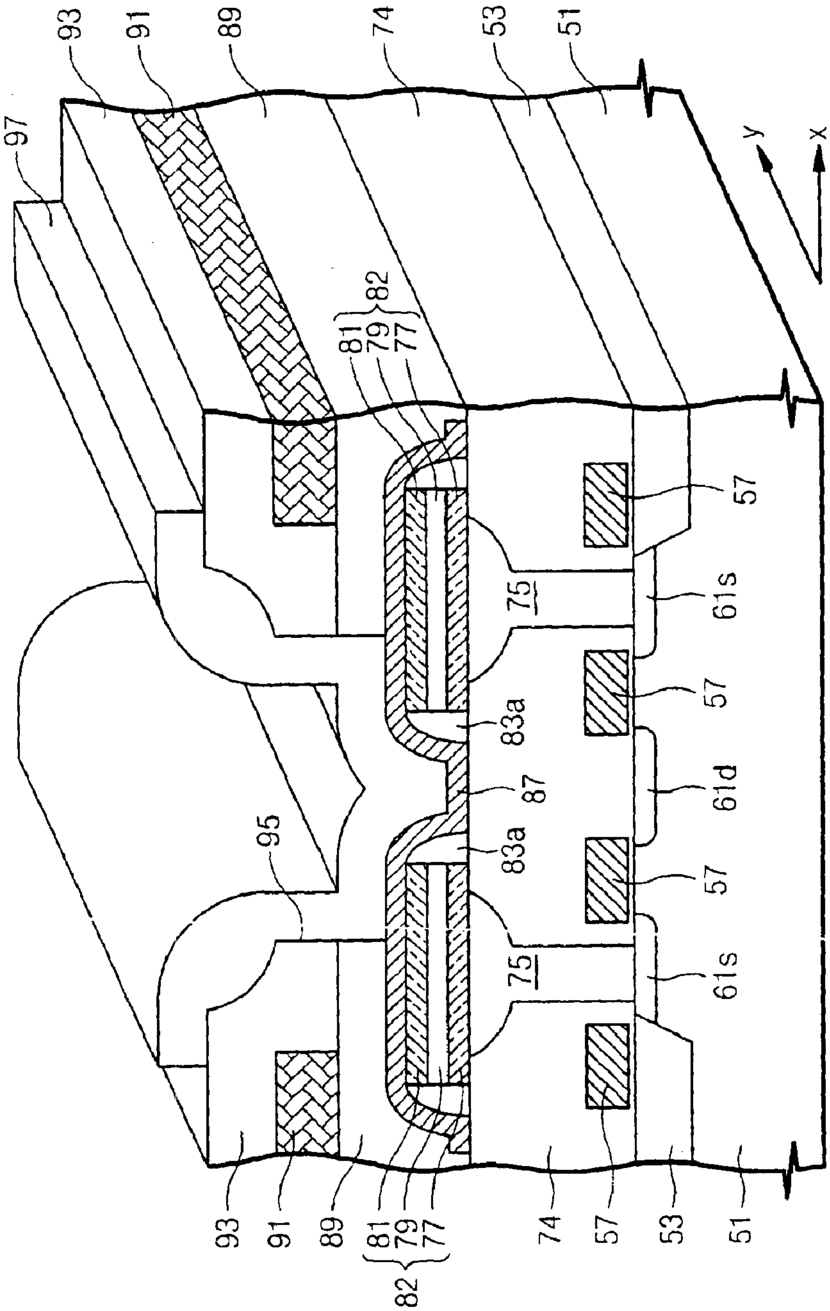
FIGS. 6 through 8 are perspective views illustrating ferroelectric memory devices according to various embodiments of the present invention.
Figure 7:
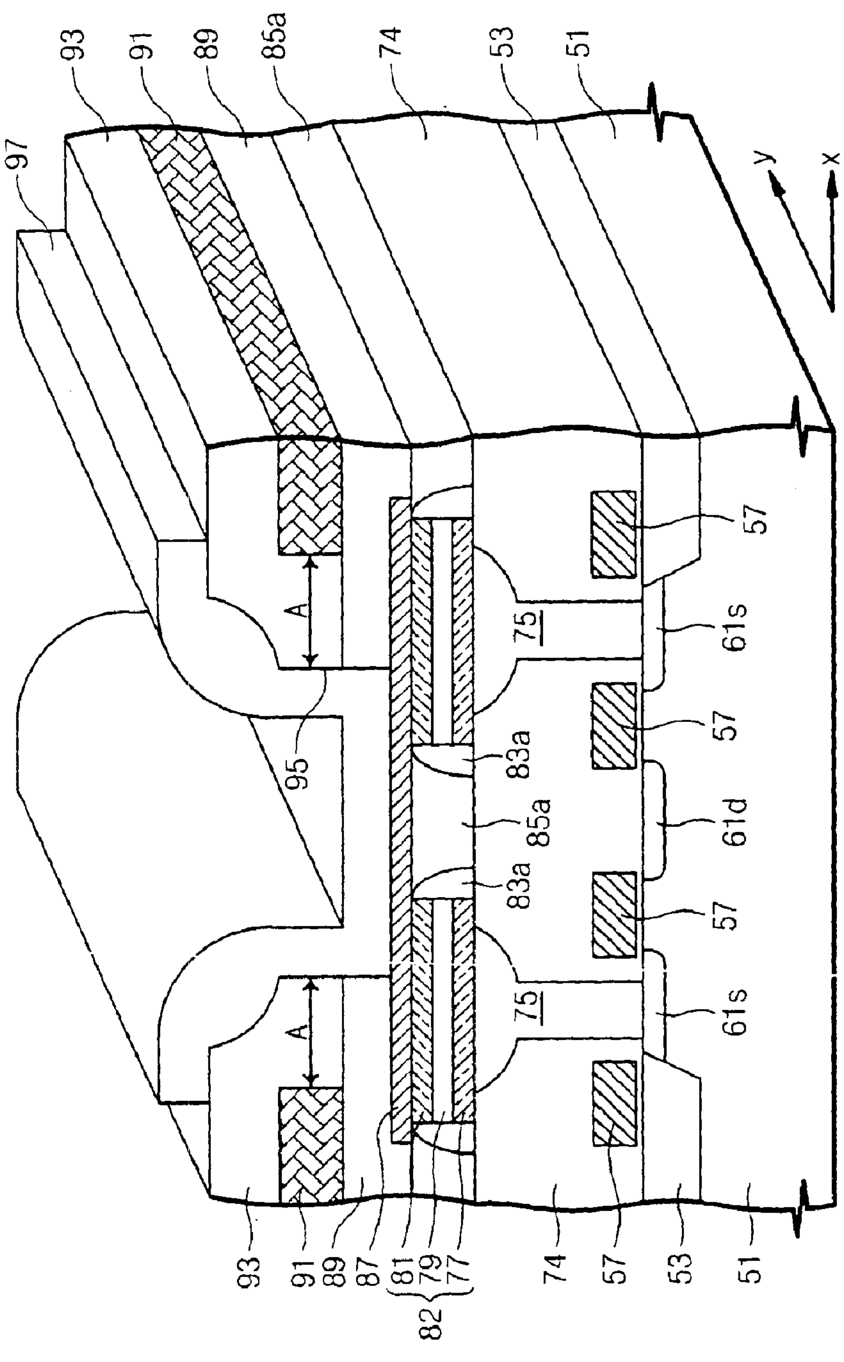
Figure 8:
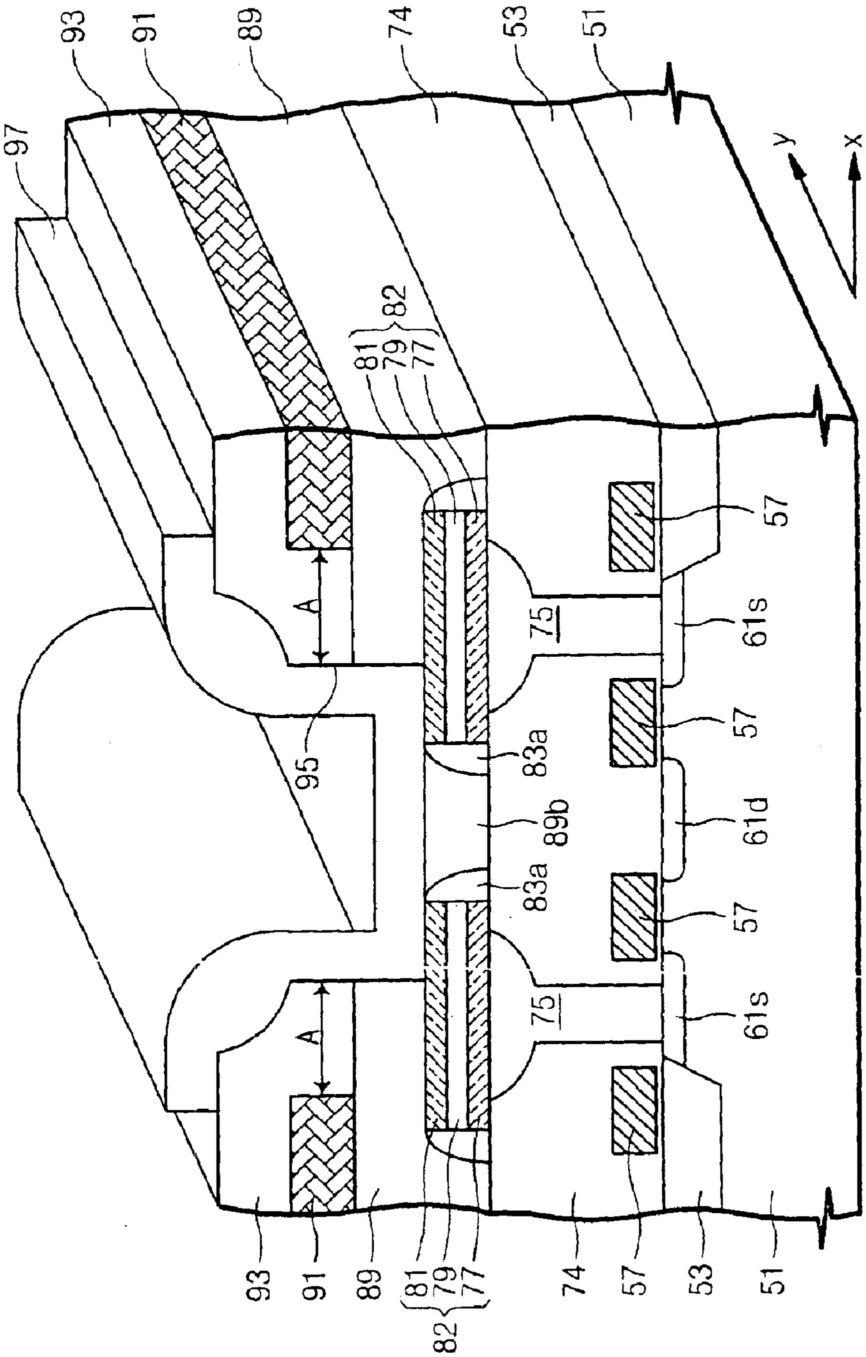

FIG. 5 is a top plan view that illustrates a portion of a cell array region of a ferroelectric memory device according various embodiments of the present invention. FIGS. 6 through 8 are perspective views that illustrate three embodiments of the present invention.

Referring to FIGS. 5 and 6, a device isolation layer 53 is formed in a predetermined region of a semiconductor substrate 51. The device isolation layer 53 defines a plurality of active regions 53*a,* which may be 2-dimensionally arranged. A plurality of insulated gate electrodes 57, which may serve as word lines, cross over the active regions 53*a* and the device isolation layer 53. The gate electrodes 57 are parallel in a row direction (y-axis). Each of the active regions 53*a* intersects with a pair of gate electrodes 57, thereby dividing the each of the active regions 53*a* into three portions. A common drain region 61*d* is formed in the active region 53*a* between the pair of gate electrodes 57, and source regions 61*s* are formed in the active regions 53*a* on both sides of the common drain region 61*d.* Cell transistors are formed where the gate electrodes 57 intersect with the active regions 53*a.* Accordingly, the illustrated cell transistors are arranged in 2-dimensions along row (x-axis) and column (y-axis) directions. It will be understood that the x and y axes are the row and column designations are used herein to indicate two different directions, which need not be orthogonal.

A lower ILD 74 is formed on the surface of the semiconductor substrate 51 and the cell transistors. A plurality of bit lines 71 are formed in the lower ILD 74 to cross over the word lines 57. Each of the bit lines 71 is electrically connected to the common drain region 61*d* via a bit line contact hole 71*a.* The source regions 61*s* are exposed by storage node contact holes 75*a* that penetrate the lower ILD 74. The storage node contact holes 75*a* may have upper sidewalls with a sloped profile. Each of the storage node contact holes 75*a* may be filled with a contact plug 75. Accordingly, as illustrated in FIG. 6, the contact plug 75 may have an upper portion that has a larger diameter (upper diameter) than that of a lower portion (lower diameter).

A plurality of ferroelectric capacitors 82 (CP shown in FIG. 5) may be 2-dimensionally arranged in the row direction (x-axis) and column direction (y-axis) on the contact plugs 75 and the surface of the semiconductor substrate 51. The ferroelectric capacitors 82 may have substantially vertical sidewalls, which may have an inclination of about 70 to about 90° relative to a top surface of the semiconductor substrate 51. The ferroelectric capacitors 82 may each include a lower electrode 77, a ferroelectric pattern 79, and an upper electrode 81, which are sequentially stacked. The lower electrode 77 may be on the contact plug 75 so as to be electrically connected to the source region 61*s.* The lower and upper electrodes 77 and 81 may be, for example, Ru, $RuO_2$, or may be a material selected from the group consisting of platinum (Pt), iridium (Ir), rhodium (Rh), osmium (Os), oxides thereof, and/or combinations thereof.

The ferroelectric pattern 79 may be PZT(Pb, Zr, $TiO_3$), which may be formed using $PbTiO_3$ as a seed layer. The ferroelectric pattern 79 may alternatively be a material that is selected from the group consisting of PZT(Pb, Zr, $TiO_3$), $SrTiO_3$, $BaTiO_3$, (Ba, Sr)$TiO_3$, Pb(Zr,Ti)$O_3$, $SrBi_2Ta_2O_9$, (Pb,La)(Zr,Ti)$O_3$, $Bi_4Ti_3O_{12}$, and/or combinations thereof. Use of PZT(Pb, Zr, $TiO_3$) as a seed layer may allow the thickness of the ferroelectric pattern 79 to be about 100 nm or less. A thinner ferroelectric pattern 79 may allow more easy fabrication of substantially vertical sidewalls for the ferroelectric capacitor 82.

Hydrogen barrier spacers 83*a* are formed on the sidewalls of the ferroelectric capacitors 82. The hydrogen barrier spacers 83*a* may be a material that is selected from the group consisting of $TiO_2$, $Al_2O_3$, $ZrO_2$, $CeO_2$, and/or combinations thereof. The hydrogen barrier spacers 83*a* may prevent or inhibit penetration of hydrogen atoms into the ferroelectric pattern 79.

When hydrogen atoms are injected into the ferroelectric pattern 79, the characteristics (e.g., reliability) of the ferroelectric pattern 79 may be reduced. For example, if hydrogen atoms are injected into a ferroelectric layer of PZT(Pb, Zr, $TiO_3$), oxygen atoms in the PZT layer may react with the hydrogen atoms to cause oxygen vacancy into the PZT layer. The oxygen vacancy may deteriorate a polarization characteristic of the ferroelectric pattern 79, which may cause the memory device to malfunction.

Figure 4:
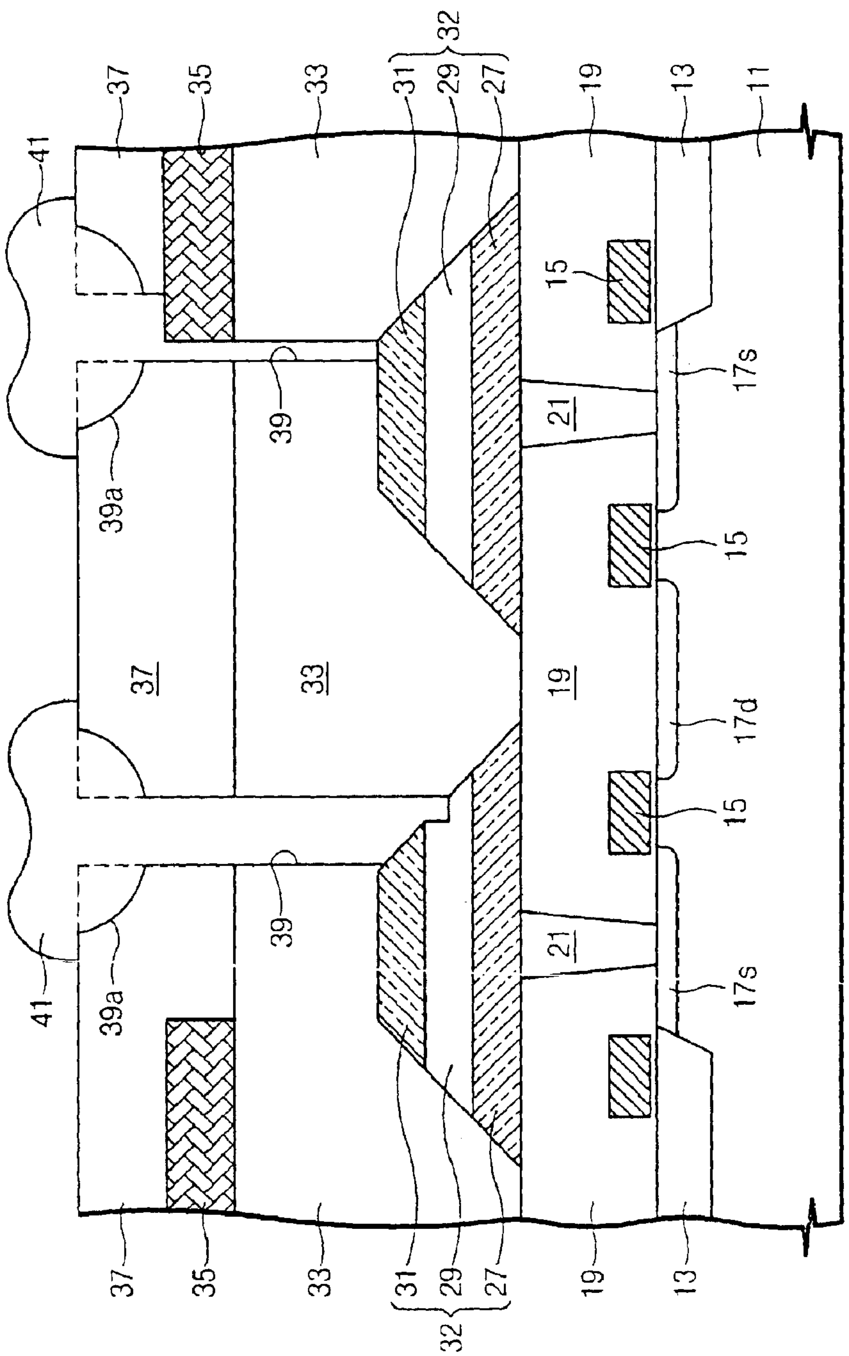

Moreover, hydrogen atoms that are caught in the interfaces between the ferroelectric pattern 79 and the upper and lower electrodes 81 and 77 may cause the ferroelectric capacitor 82 to have a poor leakage current characteristic. Consequently, the hydrogen barrier spacer 83*a* may improve characteristics, such as reliability, of the ferroelectric capacitor 82. As described above, because the ferroelectric capacitors 82 may be formed to have substantially vertical sidewalls, damage to the ferroelectric pattern 79 during subsequent process steps may be avoided, in contrast to the prior art process that is illustrated in FIG. 4.

A plurality of local plate lines 87 (PL of FIG. 5) are formed on the ferroelectric capacitors 82, and may be parallel to the row direction (y-axis) and cover sidewalls of the hydrogen barrier spacers 83*a* and top surfaces of the lower ILD 74. Each of the local plate lines 87 may cover at least two ferroelectric capacitors 82 in two adjacent rows. The local plate line 87 may directly contact the adjacent upper electrode 81, and may be insulated from the lower electrode 77 by the hydrogen barrier spacers 83*a*. An upper ILD may cover the local plate lines 87 and the surface of the semiconductor substrate 51. The upper ILD may include first and second upper ILDs 89 and 93, which are sequentially stacked.

Figure 3:
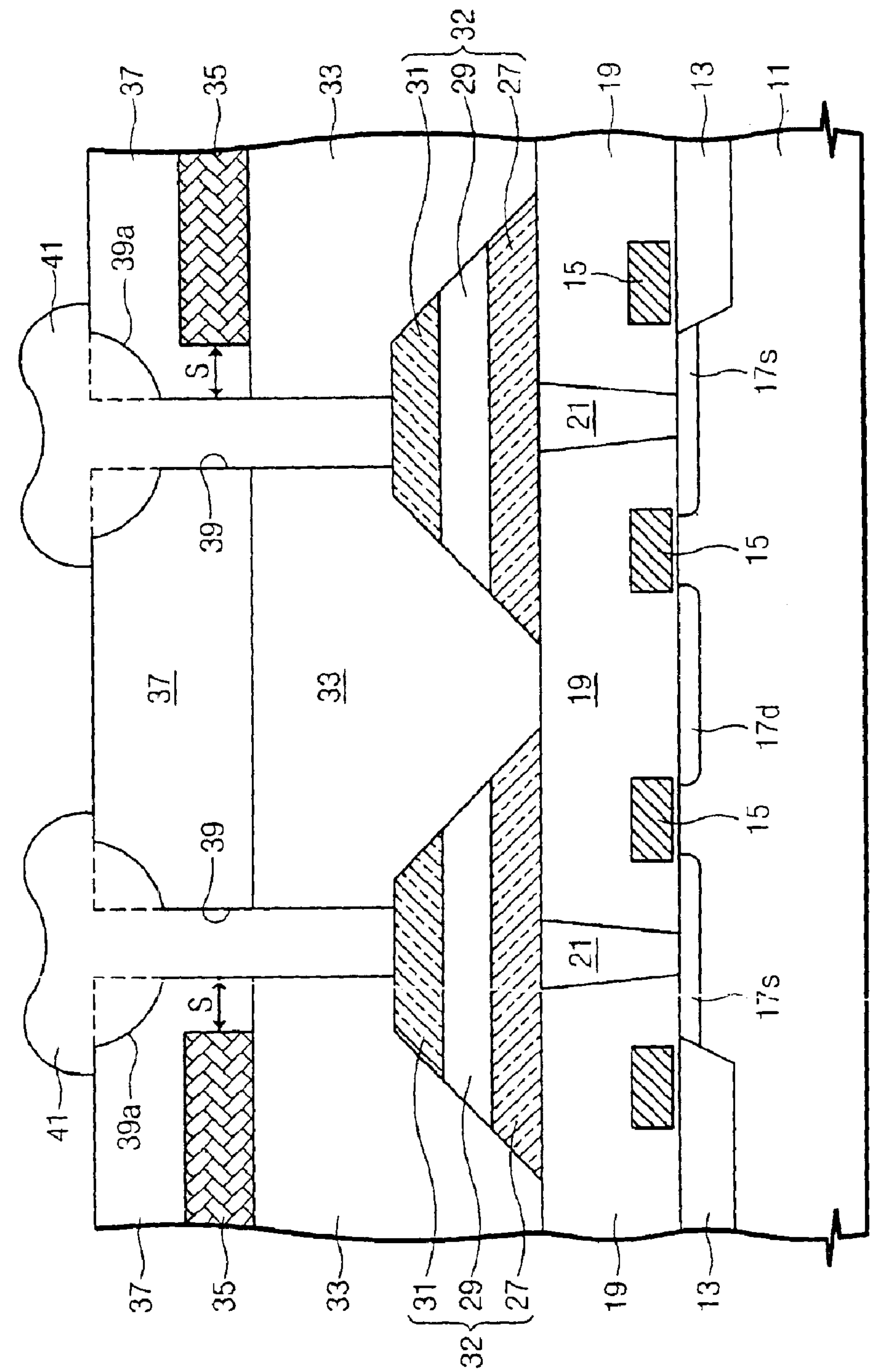

A plurality of main word lines may be between portions of the first and second upper ILDs 89 and 93. Each of the main word lines 91 may, for example, control four word lines 57 via a decoder. A main plate line 97 may be on the upper ILD between the main word lines 91. The main plate line 97 may be electrically connected to the local plate line 87 via a slit-type via hole 95 that penetrates the upper ILD (89 and 93). The slit-type via hole 95 may be parallel to the row direction (y-axis). As illustrated in FIG. 6, the slit-type via hole 95 may have a larger width than the via hole 39 that is illustrated in FIG. 3.

Figure 16:
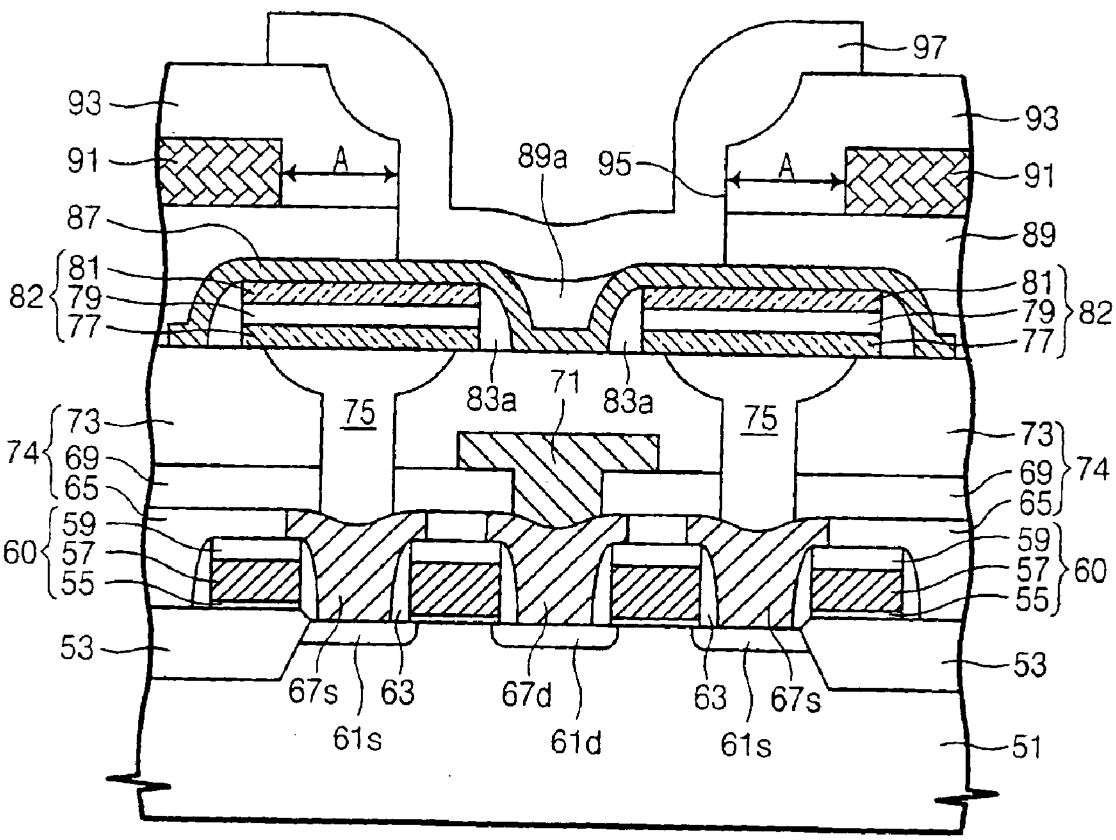

The local plate line 87 and the main plate line 97, which form a plate line, may be in directly contact with each other. The plate line may alternatively be formed from only main plate line 97, as will be discussed below with regard to a third example embodiment of the ferroelectric memory device. The plate line may, for example, be a material that is selected from the group consisting of the platinum group including ruthenium (Ru), platinum (Pt), iridium (Ir), rhodium (Rh), Osmium (Os), and palladium (Pd), oxides thereof, and/or combinations thereof. The plate line may alternatively be a material that is conventionally used in a metal layer of a semiconductor device. In a first example embodiment that is illustrated in FIG. 16, a first upper ILD pattern 89*a* may be between the local plate line 87 and the main plate line 97. As illustrated, the first upper ILD pattern 89*a* fills a gap region formed between the hydrogen barrier spacers 83*a* that are covered by the local plate line 87.

FIG. 7 is a perspective view of a ferroelectric memory device according to a second example embodiment of the present invention. In the second embodiment, cell transistors, lower ILD, upper ILD, contact plugs, ferroelectric capacitors, and hydrogen barrier spacers have the same structures as those shown for the first example embodiment of the present invention. Thus, further description of those structures will be omitted here for brevity.

Referring to FIGS. 5 and 7, a gap region between outer sidewalls of the hydrogen barrier spacers 83*a* is filled with an insulation pattern 85*a*. The insulation pattern 85*a* is also between the local plate line 87 and the lower ILD 74. The lower electrode 77 is electrically insulated from the local plate line 87 by, for example, the insulation pattern 85*a* and the hydrogen barrier space 83*a*. The insulation pattern 85*a* may be an oxide layer containing a small amount of hydrogen, and may have a top surface that is aligned with a top surface of the ferroelectric capacitor 82.

FIG. 8 is a perspective view of a ferroelectric memory device according to a third example embodiment of the present invention. In the third embodiment, cell transistors, lower ILD, upper ILD, contact plugs, ferroelectric capacitors, and hydrogen barrier spacers have the same structures as shown for the first example embodiment of the present invention. Thus, the description of those structures will be omitted here for brevity. Referring to FIGS. 5 and 8, unlike the first embodiment of the present invention that is illustrated in FIG. 6, a main plate line 97 directly contacts top surfaces of adjacent upper electrodes 81.

A gap region under the main plate line 97 and between the hydrogen barrier spacers 83*a* is filled with a first upper ILD pattern 89*b*. The first upper ILD pattern 89*b* is between the main plate line 97 and the lower ILD 74. The first upper ILD pattern 89*b* may be formed of the same material as the first upper ILD 89, or may be an oxide layer containing a small amount of hydrogen.

Figure 18:
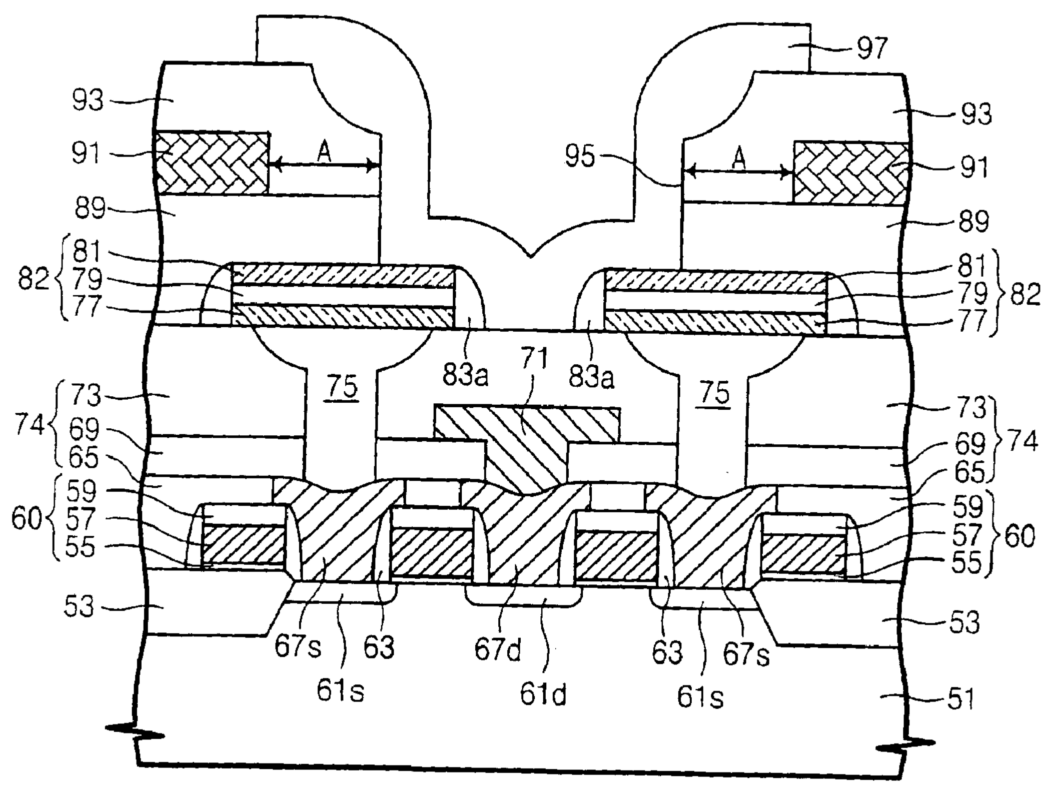

A variation of the third example embodiment of a ferroelectric memory device is illustrated in FIG. 18, in which the main plate line 97 directly contacts the top surface of the lower ILD 74 and the top surface of the two adjacent upper electrodes 81, and covers outward sidewalls of the hydrogen barrier spacer 83*a*.

Methods of fabricating ferroelectric memory devices will now be described with reference to FIGS. 9 through 14. FIGS. 9 through 14 are cross-sectional views taken along line I–I' of FIG. 5, and illustrate methods of fabricating ferroelectric memory devices according to a first example embodiment of the present invention.

Figure 9:
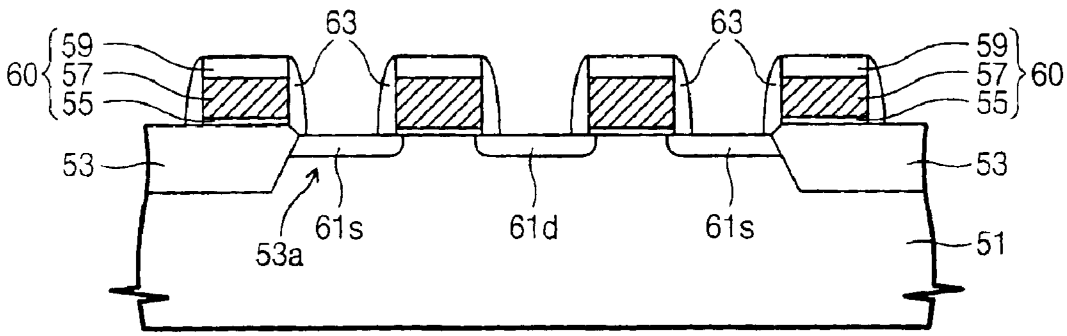
FIGS. 9 through 14 are cross-sectional views taken along line I–I' of FIG. 5, illustrating methods of fabricating ferroelectric memory devices according to some embodiments of the present invention.

Referring to FIG. 9, a device isolation layer 53 is formed at predetermined regions of a semiconductor substrate 51 to define active regions 53*a*. A gate insulation layer, a gate conductive layer, and a capping oxide layer may be sequentially formed on the entire surface of the semiconductor substrate 51 and the active regions 53*a*. The capping oxide layer, the gate conductive layer, and the gate insulation layer are successively patterned to form a plurality of gate patterns 60, which may be parallel with each other and cross over the active regions and the device isolation layer 53. Each of the gate patterns 60 may be formed of a gate insulation pattern 55, a gate electrode 57, and a capping insulation pattern 59. Each of the active regions 53*a* may intersect a pair of the gate electrodes 57. The gate electrode 57 may form a word line.

Impurity ions may be implanted into active regions using the gate patterns 60 and the device isolation layer 53 as an ion implantation mask. Thus, three impurity regions may be formed in each active region 53*a*. The middle impurity region may correspond to a common drain region 61*d*, and the other two impurity regions may correspond to source regions 61*s*. Thus, a pair of cell transistors may be formed in each of the active regions 53*a*. As shown in FIG. 9, the cell transistors may be arranged 2-dimensionally in row and column directions. Spacers 63 may be formed on sidewalls of the gate pattern 60 by, for example, a conventional fabrication process.

Figure 10:
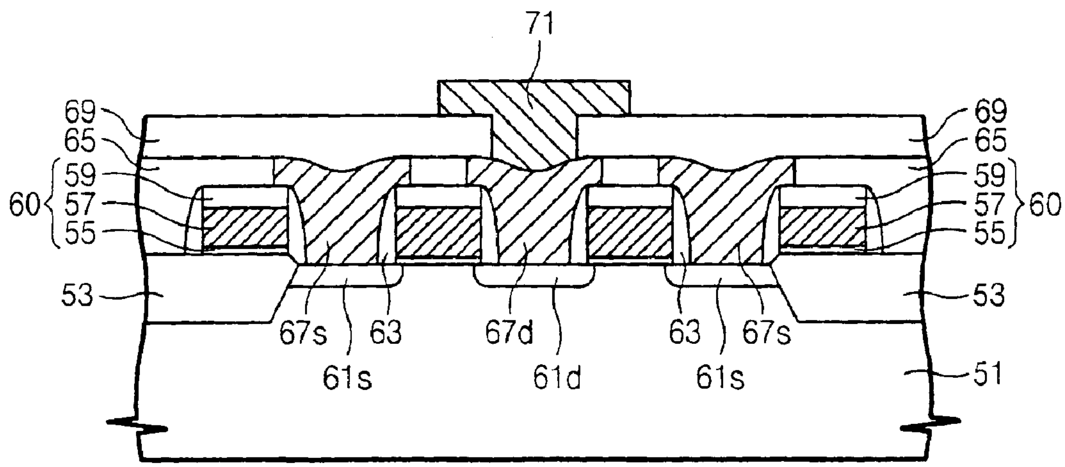

Referring to FIG. 10, a first lower ILD 65 may be formed on the spacer 63 and the surface of the semiconductor substrate 51. The first lower ILD 65 is patterned to form a pad contact hole that exposes the source and drain regions 61*s* and 61*d*. Storage node pads 67*s* and bit line pads 67*d* are formed in the pad contact hole by, for example, a conventional fabrication process. The storage node pads 67*s* are connected to the source regions 61*s*, and the bit line pads 67*d* are connected to the common drain region 61*d*. A second lower ILD 69 is formed on the pads 67*s* and 67*d* and an exposed surface of the semiconductor substrate 51. The second lower ILD 69 is patterned to form bit line contact holes (71*a* in FIG. 5) that expose the bit line pads 67*d*. A plurality of bit lines 71, which may be parallel with each other, are formed to cover the bit line contact holes. The bit lines 71 cross over top surfaces of the word lines 57.

Figure 11:
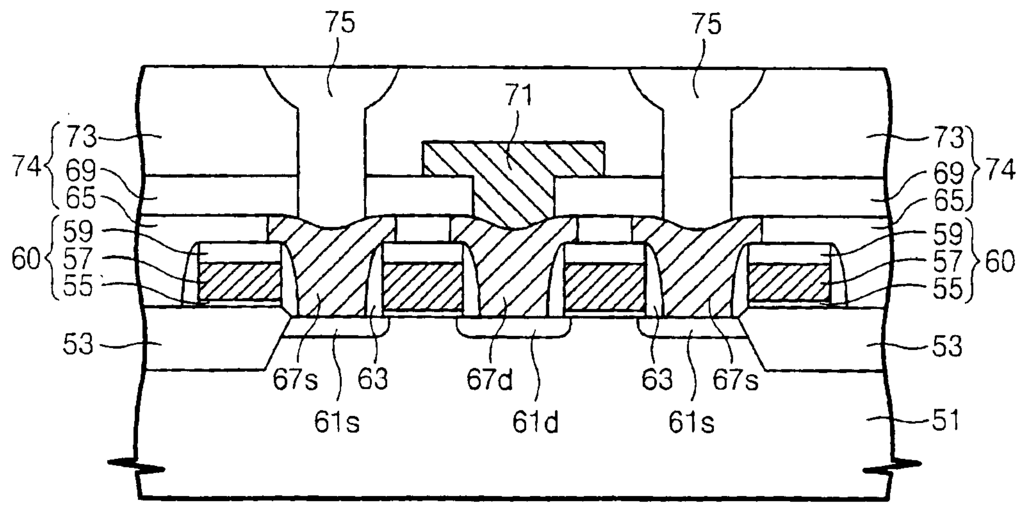

Referring to FIG. 11, a third lower ILD 73 is formed on an exposed surface of the semiconductor substrate and the bit lines 71. The first through third lower ILDs 65, 67, and 73 form a lower ILD 74. The second and third lower ILDs 69 and 73 are patterned to form storage node contact holes (75*a* in FIG. 5) that expose the storage node pads 67*s*. The storage node contact hole (75*a* in FIG. 5) may be formed using, for example, wet or dry etching processes so as to increase its upper diameter. Thus, the storage node contact hole (75*a* in FIG. 5), can include upper sidewalls with a sloped profile, which may reduce electrical resistance between a subsequently formed lower electrode and the source region 61*s*. Contact plugs 75 are formed in the storage node contact holes (75*a* in FIG. 5).

Figure 12:
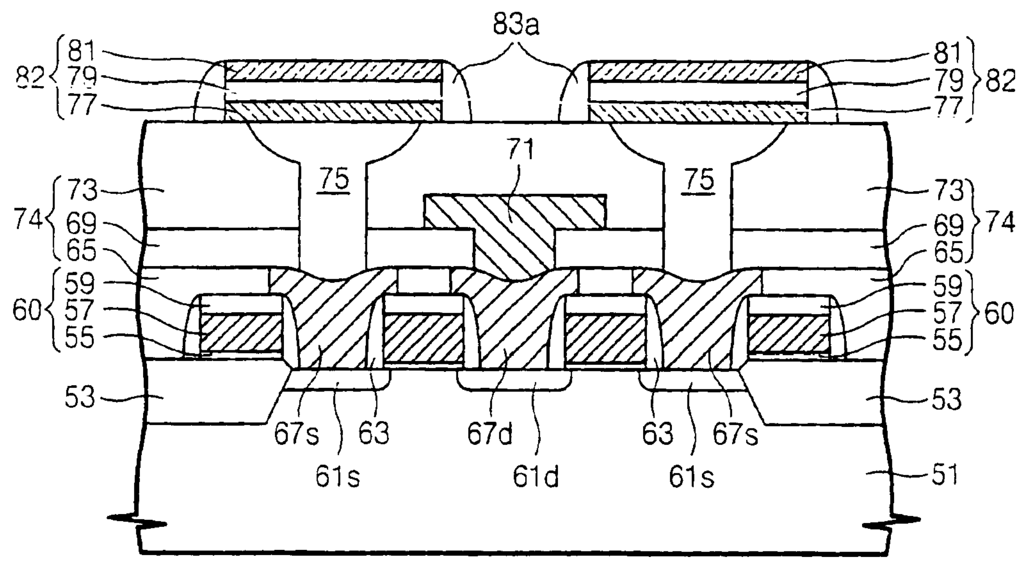

Referring to FIG. 12, a lower electrode layer, a ferroelectric layer, and an upper electrode layer are sequentially formed on the contact plugs 75 and the lower ILD 74. The upper electrode layer, the ferroelectric layer, and the lower electrode layer are successively patterned to form a plurality of ferroelectric capacitors 82 (CP of FIG. 5), which may be 2-dimensionally arranged in row and column directions. Each of the ferroelectric capacitors 82 may include a lower electrode 77, a ferroelectric pattern 79, and an upper electrode 81, which are sequentially stacked. Each of the lower electrodes 77 may contact, or otherwise be electrically connected with, the contact plugs 75. As a result, each of the ferroelectric capacitors 82 is electrically connected to the source regions 61*s*.

The ferroelectric capacitors 82 may be patterned to have substantially vertical sidewalls, which may have an inclination of about 70° to about 90° relative to a top surface of the semiconductor substrate 51. Such patterning may be facilitated by forming the lower and upper electrodes 77 and 81 of at least one of Ru and $RuO_2$, and/or using an anisotropic etching process such as, for example, a plasma etching containing oxygen. When the Ru and $RuO_2$ are etched using plasma containing oxygen, volatile $RuO_4$ may be created. The upper and lower electrodes 81 and 77 may alternatively be formed from, for example, a material that is selected from the group consisting of the platinum group including ruthenium (Ru), platinum (Pt), iridium (Ir), rhodium (Rh), and Osmium (Os), and oxides thereof, and/or combinations thereof.

The ferroelectric pattern 79 may be PZT(Pb, Zr, $TiO_3$) that si formed using $PbTiO_3$ as a seed layer. The ferroelectric pattern 79 may alternatively be formed from at least one material selected from the group consisting of $Pb(Zr, Ti)O_3$, $SrTiO_3$, $BaTiO_3$, $(Ba, Sr)TiO_3$, $Pb(Zr,Ti)O_3$, $SrBi_2Ta_2O_9$, $(Pb,La)(Zr,Ti)O_3$, and $Bi_4Ti_3O_{12}$. A PZT and $PbTiO_3$ thin layer may be formed using CSD. The CSD process may use as a precursor lead acetate[$Pb(CH3CO_2)_23H_2O$], zirconium n-butoxide [$Zr(n\text{-}OC_4H_9)_4$], and titanium isopropoxide [$Ti(i\text{-}OC_3H_7)_4$], and using a solvent 2-methoxyethano [$CH_3OCH_2CH_2OH$]. Thin PZT and $PbTiO_3$ layers may be stacked using, for example, spin coating and baking at about 200° C. The resultant structures may be annealed using, for example, rapid thermal processing (RTP) in an oxygen atmosphere of 500 to 675° C. The resulting ferroelectric pattern 79 may exhibit an improved ferroelectric characteristics, and which may allow a corresponding reduction in the thickness of the ferroelectric pattern 79 and, thereby, a reduction in the thickness of the ferroelectric capacitor. Reducing the thickness of the ferroelectric capacitor 82 allows the sidewalls of the ferroelectric capacitor 82 to be patterned to be substantially vertical sidewalls or close to vertical. For example, the ferroelectric pattern 79 and the ferroelectric capacitor 82 may have respective thicknesses of 100 nm or less and 400 nm or less.

A hydrogen barrier layer is formed on the surface of the semiconductor substrate and the ferroelectric capacitors 82. The hydrogen barrier layer may be formed from, for example, at least one selected from the group consisting of $TiO_2$, $Al_2O_3$, $ZrO_2$, and $CeO_2$. The hydrogen barrier layer may be anisotropically etched until the top surfaces of the ferroelectric capacitors 82 are exposed, thereby forming hydrogen barrier spacers 83*a* on the sidewalls of the ferroelectric capacitors 82. Because the ferroelectric capacitors 82 have substantially vertical sidewalls, the hydrogen barrier spacers 83*a* may have the shape of a conventional spacer, and hydrogen atoms that are used in later fabrication processes may not penetrate into the ferroelectric pattern 79, or penetration may be reduced. But for the hydrogen barrier spacers 83*a,* hydrogen atoms may be allowed to be injected into the ferroelectric capacitors 79, and which may result in degraded characteristics, such as reduced polarization and increased leakage current. Accordingly, the hydrogen barrier spacer 83*a* may enhance the characteristics of the ferroelectric capacitor 82.

Figure 13:
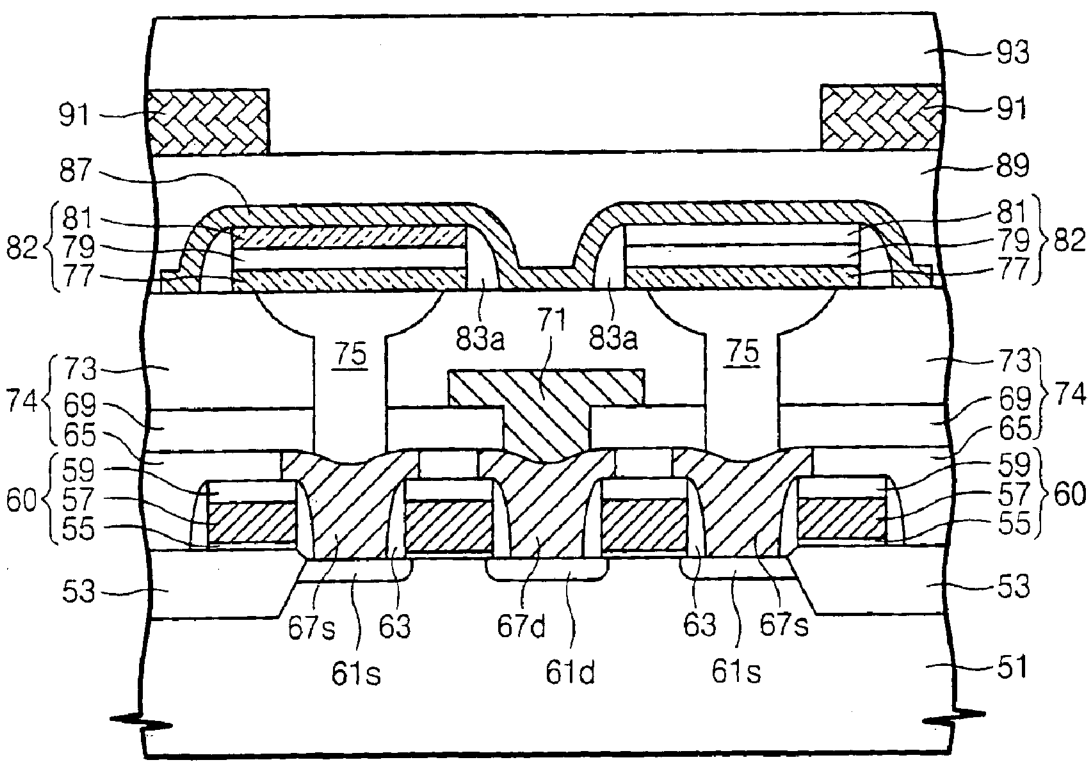

Referring to FIG. 13, a lower plate layer is formed on the exposed surface of the semiconductor substrate and the hydrogen barrier spacer 83*a*. The lower plate layer is patterned to form a plurality of local plate lines 87 (PL in FIG. 5), that may be parallel to the word lines 57 (the row direction or y-axis in FIG. 5). Each of the local plate lines 87 may directly contact a plurality of upper electrodes 81 that are, for example, in two adjacent rows. The local plate lines 87 may also cover outward sidewalls of the hydrogen barrier spacers 83*a* and an exposed top surface of the lower ILD 74 therebetween. The local plate lines 87 are insulated from the lower electrodes 77 by the hydrogen barrier spacers 83*a* therebetween. The lower plate layer may be formed from, for example, at least one material selected from the group consisting of the platinum group including ruthenium (Ru), platinum (Pt), iridium (Ir), rhodium (Rh), Osmium (Os), and palladium (Pd), and oxides thereof.

An upper ILD is formed on the exposed surface of the semiconductor substrate and the local plate lines 87. The upper ILD may be formed by sequentially stacking the first and second upper ILDs 89 and 93. Before forming the second upper ILD 93, a plurality of main word lines 91, which are parallel with each other, may be formed on the first upper ILD 89. A single main word line 91 may control, for example, four word lines 57 via a decoder.

Figure 14:
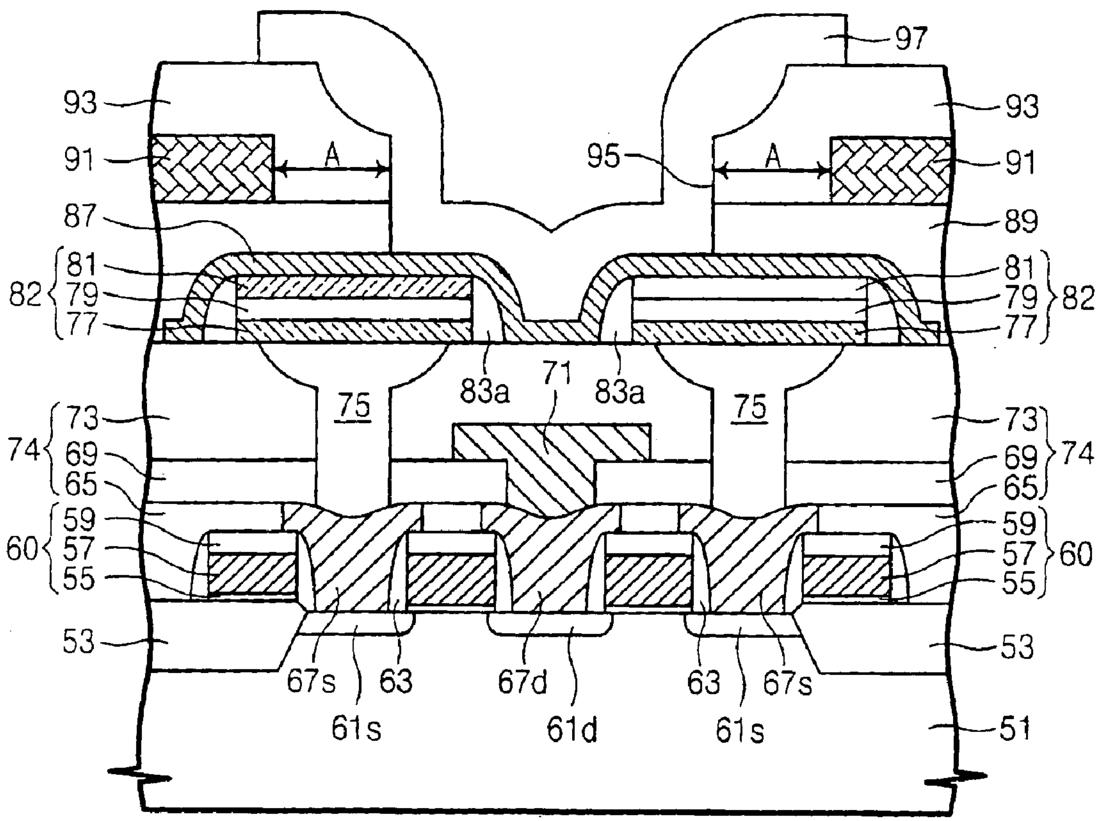

Referring to FIG. 14, the upper ILD is patterned to form a slit-type via hole 95 that exposes the local plate line 87. The slit-type via hole 95 is between the main word lines 91 and may be parallel with the main word lines 91. As illustrated in FIG. 14, an upper portion of the slit-type via hole 95 may have a greater width than a lower portion thereof. However, as illustrated, a space A may still be present between the slit-type via hole 95 and main word lines 91, in contrast to the via hole 39 that is illustrated in FIG. 4 that exposes the main word line 35. Consequently, even if the slit-type via hole 95 is formed using wet or dry etching processes to reduce an aspect ratio of the slit-type via hole 95, the main word lines 91 may not be exposed. Accordingly, an aspect ratio of the slit-type via hole 95 may be reduced without exposing the main word lines 91, and/or the exposed area of the local plate line 87 may be increased.

Next, an upper plate layer such as a metal layer may be formed on the exposed surface of the resultant structure including the slit-type via hole 95. Because the slit-type via hole 95 may have a low aspect ratio, the upper plate layer may exhibit good step coverage. The upper plate layer may be patterned to form a main plate line 97 that covers the slit-type via hole 95. A plate line may then include one or both of the local plate line 87 and the main plate line 97.

Figure 15:
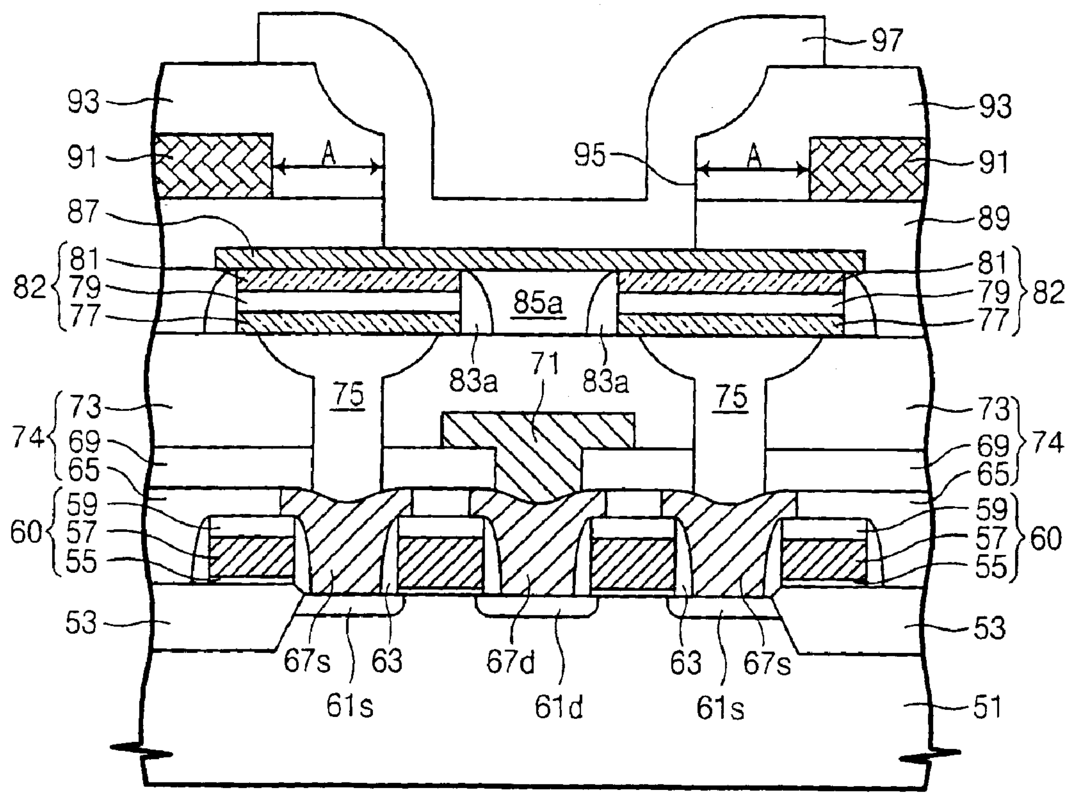
FIGS. 15 through 18 are cross-sectional views taken along line I–I' of FIG. 5, illustrating methods of fabricating ferroelectric memory devices according to some other embodiments of the present invention.
Figure 17:
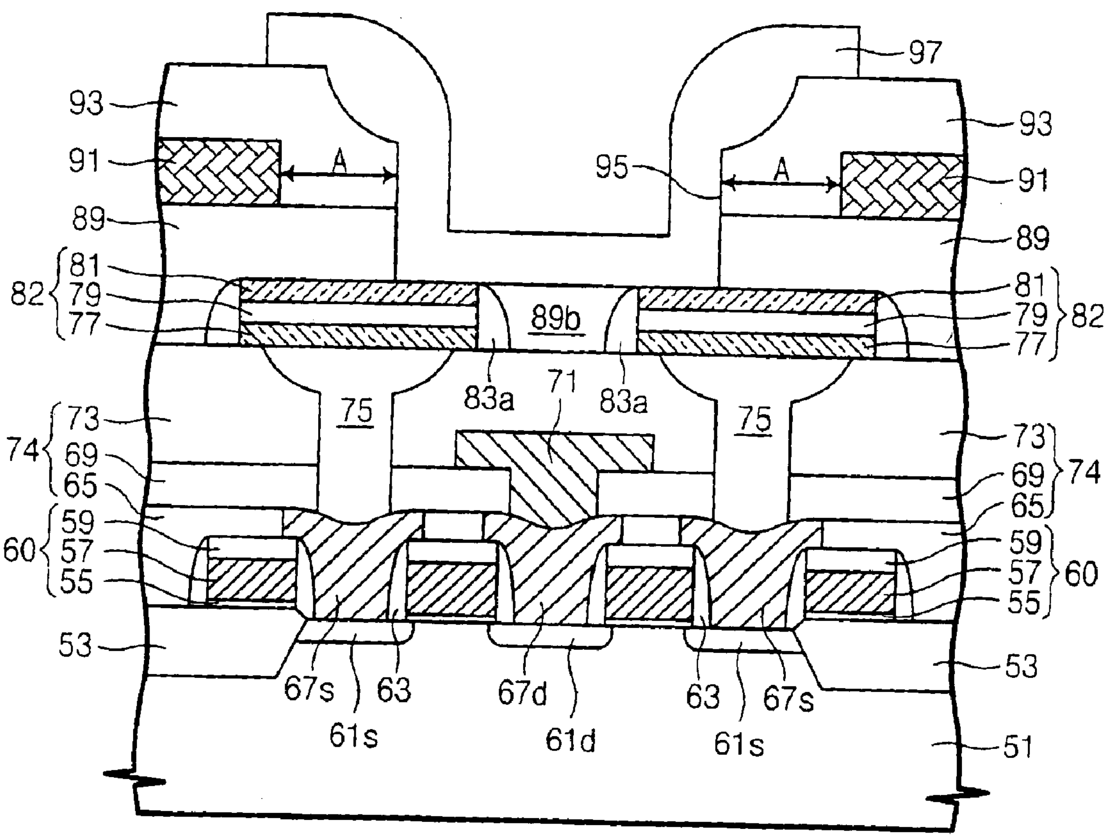

FIGS. 15 and 17 are cross-sectional views that illustrate methods of fabricating ferroelectric memory devices according to second and third example embodiments of the present invention. FIGS. 16 and 18 are cross-sectional views that illustrate methods of fabricating ferroelectric memory devices according to further variations of the second and third example embodiments of the present invention, respectively. The following embodiments include steps that described with reference to FIGS. 9 through 12.

The steps of forming an upper ILD and a main word line may be the same as those in the first embodiment, and accordingly these steps will not be repeated here for brevity.

A second example embodiment is illustrated in FIG. 15, that, in comparison to the embodiment illustrated in FIG. 14, further comprises an insulation pattern 85*a* and a local plate line 87. An insulation layer may be formed on the exposed surface of the semiconductor substrate and the hydrogen barrier spacers 83*a*. The insulation layer may be, for example, a material containing a small amount of hydrogen, and have less tensile stress. The insulation pattern 85*a* may then be formed by planarizing the insulation layer, such as by etching, until the top surface of the upper electrode 81 is exposed. Etching may be performed using an etch selectivity with respect to the upper electrode 81 and the hydrogen barrier spacer 83*a*. The insulation pattern 85*a* may thereby fill a gap region between the hydrogen barrier spacers 83*a*. The insulation pattern 85*a* may alternatively have a lower top surface than the ferroelectric capacitor 82.

A lower plate layer may be formed on the surface of the semiconductor substrate and the insulation pattern 85*a,* and then patterned to form the local plate line 87. The patterning process may use an etch selectivity with respect to the insulation pattern 85*a* or the hydrogen barrier spacers 83*a*. Each of the local plate lines 87 may directly contact the upper electrodes 81, such as contacting, for example, two adjacent rows of upper electrode 81. The local plate lines 87 cover the top surfaces of the insulation pattern 85*a.* The remaining steps for forming the ferroelectric memory device, including forming the main plate line 97, may be the same as those described above for FIG. 14, and which are not repeated here for brevity.

The ferroelectric memory device that is illustrated in FIG. 16 is similar to the one shown in FIG. 14 except for the formation of a slit-type via hole 95. Using fabrication steps that were discussed with reference to FIG. 13, a local plate line 87 and an upper ILD are formed. The upper ILD is patterned to form a slit-type via hole 95 that exposes the top surface of the local plate line 87. A patterning process is performed so that the first upper ILD pattern 89*a* surrounded by the local plate line 87 remains between the hydrogen barrier spacer 83*a*. Top surfaces of the local plate lines 87 are prevented from etching damages during the patterning process. The main plate line 97 is formed thereon.

The ferroelectric memory devices that are illustrated in FIGS. 17 and 18 are similar to the one shown in FIG. 14 except for the absence of a local plate line (87 of FIG. 14). A first upper ILD 89, a main word line 91, and a second upper ILD 93 are formed on structure that includes the semiconductor substrate 51 and the hydrogen barrier spacers 83*a.* The upper ILDs 93 and 89 are patterned to form a slit-type via hole 93 that exposes the top surface of the plurality of upper electrodes 81, which may be arranged in two rows adjacent to each other.

The slit-type via hole 95 may be patterned such that the upper ILD 89 remains between the hydrogen barrier spacers 83*a* (see FIG. 17). Thus, a first upper ILD pattern 89*b* is between the hydrogen barrier spacers 83*a.* In contrast as illustrated in FIG. 18, the slit-type via hole 95 exposes the top surface of the lower ILD 74. The hydrogen barrier spacer 83*a* and the first upper ILD 89 may be formed of materials having an etch selectivity with respect to each other.

An upper plate layer is formed on the surface of the resultant structure where the slit-type via hole 95 is formed. The upper plate layer may be patterned to form a man plate line 97 covering the slit-type via hole 95. The main plate line 97 may directly contact, for example, two adjacent electrodes 81 that are in two rows.

Accordingly, various embodiments of the present invention may provide a plate line that directly contacts upper electrodes of a plurality of capacitors, and which may be arranged in at least two adjacent rows. The use of a plate line may increase the integration density of the ferroelectric memory device and/or improve its characteristics, such as its reliability.

Various embodiments may provide ferroelectric capacitors that have substantially vertical sidewalls. Accordingly, damage to ferroelectric patterns may be avoided or reduced when hydrogen barrier spacers are formed to insulate the plate line from lower electrodes, and the characteristics of the ferroelectric capacitor, such as its reliability, may be improved.

While the present invention has been described in detail, it should be understood that various changes, substitutions and alterations could be made hereto without departing from the spirit and scope of the invention as defined by the appended claims.

What is claimed is:

1. A ferroelectric memory device comprising:

a semiconductor substrate;

a lower interlayer dielectric on the semiconductor substrate;

a plurality of ferroelectric capacitors on the lower interlayer dielectric;

a plate line that extends across and electrically connects to surfaces of at least two adjacent ones of the plurality of ferroelectric capacitors, wherein sidewalls of the ferroelectric capacitors are substantially vertical relative to a top surface of the semiconductor substrate;

an upper interlayer dielectric on the lower interlayer dielectric and the plurality of ferroelectric capacitors; and hydrogen barrier spacers between sidewalls of the ferroelectric capacitors and the lower interlayer dielectric, wherein the plate line covers sidewall of the hydrogen barrier spacers and a surface of the lower interlayer dielectric.

2. The device as claimed in claim 1, wherein the hydrogen barrier spacers are at least one from the group consisting of $TiO_2$, $Al_2O_3$, $ZrO_2$, and $CeO_2$.

3. The device as claimed in claim 1, wherein he plate line comprises:

a local plate line directly contacting the surfaces of the at least two adjacent ferroelectric capacitors; and a main plate line on the upper interlayer dielectric opposite to the local plate line and directly contacting a surface of the local plate line via a slit-type via hole through the upper interlayer dielectric.

4. The device as claimed in claim 3, wherein the upper interlayer dielectric is between the local plate line and main plate line.

5. The device as claimed in claim 1, wherein the plurality of ferroelectric capacitors are arranged in rows and columns.

6. The device as claimed in claim 1, wherein sidewalls of the ferroelectric capacitors have an inclination of about 70° to about 90° relative to a top surface of the semiconductor substrate.

7. The device as claimed in claim 1, wherein tie ferroelectric capacitor comprises a lower electrode, a ferroelectric pattern, and an upper electrode, wherein the plate line directly contacts the upper electrodes of at least two adjacent ones of the plurality of ferroelectric capacitors.

8. The device as claimed in claim 7, wherein the lower electrode and the upper electrode comprise at least one of ruthenium and ruthenium oxide.

9. The device as claimed in claim 7, wherein the ferroelectric pattern comprises PZT(Pb, Zr, $TiO_3$) with $PbTiO_3$ as a seed layer.

10. The device as claimed in claim 7, wherein the ferroelectric pattern is at least one material from the group consisting of $SrTiO_3$, $BaTiO_3$, (Ba, Sr)$TiO_3$, Pb(Zr,Ti)$O_3$, $SrBi_2Ta_2O_9$, (Pb,La)(Zr,Ti)$O_3$, and $Bi_4Ti_3O_{12}$.

11. The device as claimed in claim 1, wherein tie plate line is at least one material from the group consisting of the platinum group including ruthenium, platinum, iridium, rhodium, Osmium, and palladium, and oxides thereof.

12. The device as claimed in claim 1, wherein the plate line is a local plate line directly contacting the surfaces of at least two adjacent ones of the plurality of ferroelectric capacitors, and further comprising an upper interlayer dielectric covering the local plate line.

13. The device as claimed in claim 1, further comprising an insulation pattern between the plate line and the lower interlayer dielectric.

14. The device as claimed in claim 13, wherein the insulation pattern is an upper interlayer dielectric.

15. The device as claimed in claim 1, further comprising an upper interlayer dielectric on the plurality of ferroelectric capacitors, and main word lines on the upper interlayer dielectric.

16. A ferroelectric memory device comprising:

a semiconductor substrate;

a lower interlayer dielectric on the semiconductor substrate;

a plurality of ferroelectric capacitors on the lower interlayer dielectric;

a plate line that extends across and electrically connects to surfaces of at least two adjacent ones of the plurality of ferroelectric capacitors, wherein sidewalls of the ferroelectric capacitors are substantially vertical relative to a top surface of the semiconductor substrate; and an upper interlayer dielectric covering on the plurality of ferroelectric capacitors, and wherein the plate line is a main plate line directly contacting the surfaces of the at least two adjacent ones of the plurality of ferroelectric capacitors via a slit-type via hole penetrating the upper interlayer dielectric.

17. A method of fabricating a ferroelectric memory device, comprising:

forming a lower interlayer dielectric on a semiconductor substrate;

forming a plurality of ferroelectric capacitors on the lower interlayer dielectric;

forming a plate line that extends across and electrically connects to surfaces of at least two adjacent ones of the plurality of ferroelectric capacitors, wherein sidewalls of the ferroelectric capacitors are formed to be substantially vertical relative to a top surface of the semiconductor substrate;

forming hydrogen barrier spacers between sidewalls of the ferroelectric capacitors and the lower interlayer dielectric; and forming an upper interlayer dielectric on the lower interlayer dielectric and the plurality of ferroelectric capacitors, wherein the forming a plate line comprises forming the plate line on sidewalls of the hydrogen barrier spacers and a surface of the lower interlayer dielectric.

18. The method as claimed in claim 17, wherein the hydrogen barrier spacers are formed from a material selected from one or more of the group consisting of $TiO_2$, $Al_2O_3$, $ZrO_2$, and $CeO_2$.

19. The method as claimed in claim 17, wherein forming the plate line comprises:

forming a lower plate layer on the semiconductor substrate and the hydrogen barrier spacers; and patterning the lower plate layer to form a plurality of parallel local plate lines, wherein each of the local plate lines directly contacts surface of at least two adjacent ones of the plurality of ferroelectric capacitors.

20. The method as claimed in claim 19, wherein prior to the forming the lower plate line, the method further comprises:

forming an insulation layer on the semiconductor substrate and the hydrogen barrier spacers; and planarizing the insulation layer until surfaces of the ferroelectric capacitors are exposed, and leaving an insulation pattern filling a gap region between the ferroelectric capacitors.

21. The method as claimed in claim 19, wherein after forming the local plate line, the method further comprises sequentially forming a first upper interlayer dielectric layer and a second upper interlayer dielectric layer on the local plate lines.

22. The method as claimed in claim 17, wherein forming a plurality of ferroelectric capacitors comprises:

sequentially forming a lower electrode layer, a ferroelectric layer, and an upper electrode layer on the lower interlayer dielectric; and successively patterning the upper electrode layer, the ferroelectric layer, and the lower electrode layer to form a plurality of stacked lower electrode, ferroelectric pattern, and upper electrode structures that are arranged in row and column directions.

23. The method as claimed in claim 22, wherein the lower electrode layer and the upper electrode layer re formed from at least one of ruthenium and ruthenium oxides.

24. The method as claimed in claim 22, wherein successively patterning the upper electrode layer, the ferroelectric capacitor layer, and the lower electrode layer comprises anisotropically etching using a plasma containing oxygen.

25. The method as claimed in claim 22, wherein the ferroelectric pattern is formed from at least one material in the group consisting of PZT(Pb, Zr, $TiO_3$), $SrTiO_3$, $BaTiO_3$, (Ba, Sr)$TiO_3$, Pb(r,Ti)$O_3$, $SrBi_2Ta_2O_9$, (Pb,La)(Zr,Ti)$O_3$, and $Bi_4Ti_3O_{12}$, and wherein the ferroelectric pattern is formed using $PbTiO_3$ as a seed layer.

26. The method as claimed in claim 22, wherein the ferroelectric layer is formed using a chemical solution deposition using a precursor of at least one of lead acetate [$Pb(CH_3CO_2)_2 3H_2O$], zirconium n-butoxide [$Zr(n\text{-}OC_4H_9)_4$], and titanium isopropoxide [$Ti(i\text{-}OC_3H_7)_4$], and using a solvent 2-methoxyethano [$CH_3OCH_2CH_2OH$].

27. The method as claimed in claim 17, wherein sidewalls of the ferroelectric capacitors have an inclination of about 70° to about 90° relative to a top surface of the semiconductor substrate.

28. The method as claimed in claim 17, wherein the forming the hydrogen barrier spacers comprises:

conformally forming a hydrogen barrier layer on the ferroelectric capacitors and the semiconductor substrate; and anisotropically etching the hydrogen barrier layer until surfaces of the ferroelectric capacitors are exposed, wherein the hydrogen barrier layer is formed from at least one material selected from the group consisting of $TiO_2$, $Al_2O_3$, $ZrO_2$, and $CeO_2$.

29. A method of fabricating a ferroelectric memory device, comprising:

forming a lower interlayer dielectric on a semiconductor substrate;

forming a plurality of ferroelectric capacitors on the lower interlayer dielectric;

forming a plate line that extends across and electrically connects to surfaces of at least two adjacent ones of the plurality of ferroelectric capacitors, wherein sidewalls of the ferroelectric capacitors are formed to be substantially vertical relative to a top surface of the semiconductor substrate;

forming hydrogen barrier spacers between sidewalls of the ferroelectric capacitors and the lower interlayer dielectric;

forming an upper interlayer dielectric on the lower interlayer dielectric and the plurality of ferroelectric capacitors, wherein forming the plate line comprises:

forming a lower plate layer on the semiconductor substrate and the hydrogen barrier spacers; and patterning the lower plate layer to form a plurality of parallel local plate lines, wherein each of the local plate lines directly contacts surfaces of at least two adjacent ones of the plurality of ferroelectric capacitors, wherein after forming the local plate line further comprising sequentially forming a first upper interlayer dielectric layer and a second upper interlayer dielectric layer on the local plate lines;

successively patterning the second and first upper interlayer dielectric layers to form a slit-type via hole exposing a portion of the local plate lines; and forming a main plate line covering the slit-type via hole.

30. A method of fabricating a ferroelectric memory device, comprising:

forming a lower interlayer dielectric on a semiconductor substrate;

forming a plurality of ferroelectric capacitors on the lower interlayer dielectric;

forming a plate line that extends across and electrically connects to surfaces of at least two adjacent ones of the plurality of ferroelectric capacitors, wherein sidewalls of the ferroelectric capacitors are formed to be substantially vertical relative to a top surface of the semiconductor substrate;

forming hydrogen barrier spacers between sidewalls of the ferroelectric capacitors and the lower interlayer dielectric; and forming an upper interlayer dielectric on the lower interlayer dielectric and the plurality of ferroelectric capacitors, wherein forming the upper interlayer dielectric and the forming the plate line comprises:

sequentially forming first and second upper interlayer dielectrics on the hydrogen barrier spacers and the semiconductor substrate; and successively patterning the second and first upper interlayer dielectrics to form a slit-type via hole exposing a surface of the ferroelectric capacitor in a row direction; and forming a main plate line covering the slit-type via hole.

31. The method as claimed in claim 30, wherein the slit-type via hole exposes a surface of the lower interlayer dielectric between the ferroelectric capacitors.

32. The method as claimed in claim 30, wherein the forming the slit-type via hole comprises leaving a portion of the first upper interlayer dielectric between the hydrogen barrier spacers.

33. The method as claimed in claim 30, wherein the sequentially forming first and second upper interlayer dielectrics comprises forming main word lines between the first and second upper interlayer dielectrics.

* * * * *

UNITED STATES PATENT AND TRADEMARK OFFICE

CERTIFICATE OF CORRECTION

PATENT NO. : 6,952,028 B2 | Page 1 of 1
APPLICATION NO. : 10/624327
DATED : October 4, 2005
INVENTOR(S) : Lee et al.

It is certified that error appears in the above-identified patent and that said Letters Patent is hereby corrected as shown below:

Column 10,
Line 45 should read -- wherein the plate line covers sidewalls of the hydrogen --

Column 11,
Line 1 should read -- 7. The device as claimed in claim 1, wherein the ferro- --

Line 15 should read -- 11. The device as claimed in claim 1, wherein the plate line --

Column 12,
Line 53 should read -- (Ba, Sr)$TiO_3$, Pb(Zr,Ti)$O_3$, $SrBi_2Ta_2O_9$, (Pb,La)(Zr,Ti)$O_3$, --

Signed and Sealed this

First Day of May, 2007

JON W. DUDAS
*Director of the United States Patent and Trademark Office*